United States Patent [19]

Moghe et al.

[11] Patent Number: 4,479,100

[45] Date of Patent: Oct. 23, 1984

[54] IMPEDANCE MATCHING NETWORK COMPRISING SELECTABLE CAPACITANCE PADS AND SELECTABLE INDUCTANCE STRIPS OR PADS

[75] Inventors: Sanjay B. Moghe, Troy, N.Y.; Roger E. Gray, Nashua, N.H.; Wei Tsai, Lexington, Mass.

[73] Assignee: Raytheon Company, Lexington, Mass.

[21] Appl. No.: 382,733

[22] Filed: May 27, 1982

[51] Int. Cl.³ .................. H03H 7/38; H01F 5/00; H01G 5/01; H01P 1/00
[52] U.S. Cl. .................... 333/33; 333/246; 336/200; 361/278
[58] Field of Search ........... 333/238, 246, 33, 161, 333/204; 336/200; 361/328, 329, 401, 278, 277, 292; 357/51

[56] References Cited

U.S. PATENT DOCUMENTS

| | | | |
|---|---|---|---|
| 3,879,690 | 5/1974 | Geolant et al. | 333/204 |
| 3,959,749 | 5/1976 | Ikushima et al. | 333/33 X |
| 4,035,695 | 7/1977 | Knutson et al. | 336/200 X |
| 4,110,715 | 7/1977 | Reindel | 333/204 |
| 4,184,133 | 1/1980 | Gehle | 333/238 |
| 4,190,854 | 2/1980 | Redfern | 357/51 |
| 4,241,360 | 12/1980 | Hambor et al. | 357/51 X |
| 4,288,759 | 9/1981 | Stover | 333/246 X |
| 4,326,180 | 4/1982 | Ferri | 333/246 |

*Primary Examiner*—Paul L. Gensler
*Assistant Examiner*—Benny Lee
*Attorney, Agent, or Firm*—Richard M. Sharkansky; Joseph D. Pannone

[57] ABSTRACT

A customizable impedance matching network for coupling a microwave transmission line to an FET. The network includes a plurality of conductive pads formed on the first surface of a dielectric substrate each pad providing in combination with the substrate and a conductor formed on an opposite surface of the substrate, a predetermined capacitance. Selective ones of such conductive pads are interconnected in parallel to form a capacitor having a capacitance related to the total surface area of such interconnected conductive pads, to provide the requisite capacitive reactance for the network. The network further includes a strip conductor formed on such first surface having a predetermined inductance per unit length and having a first end electrically connected to the network. A first end of a selected length of bonding wire is attached to such strip conductor at a bonding point between the ends of such strip conductor to provide an inductor having an inductance related to the sum of the lengths of the bonding wire and the length of the strip conductor between the bonding point and the first end of such strip conductor. Such inductor provides the requisite inductive reactance for the network. Alternatively, the requisite inductive reactance may be provided by a second plurality of conductive pads formed on such first surface selectively interconnected together with selected lengths of bonding wire. The inductance of such inductor is related to the total length of such bonding wire.

6 Claims, 7 Drawing Figures

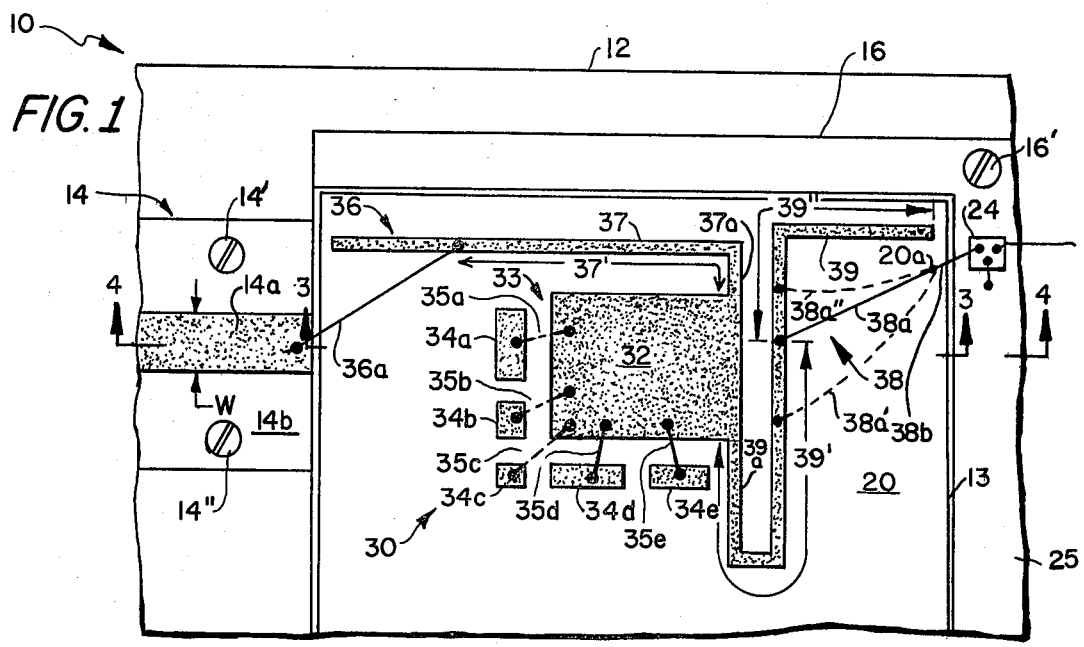
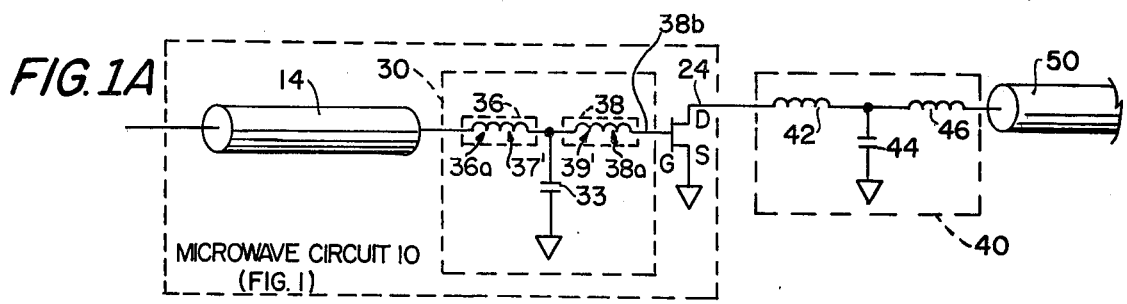
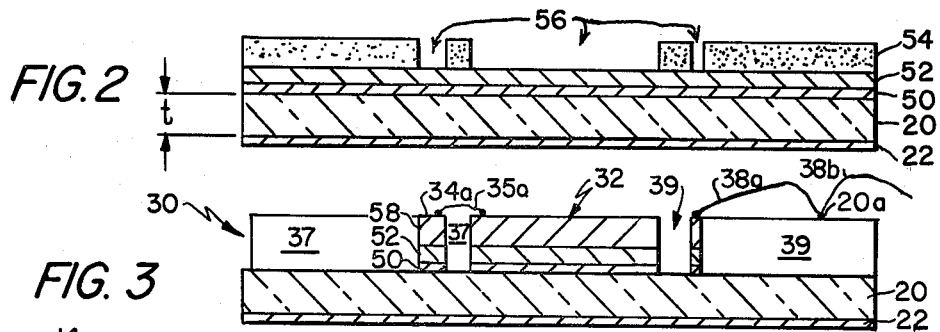
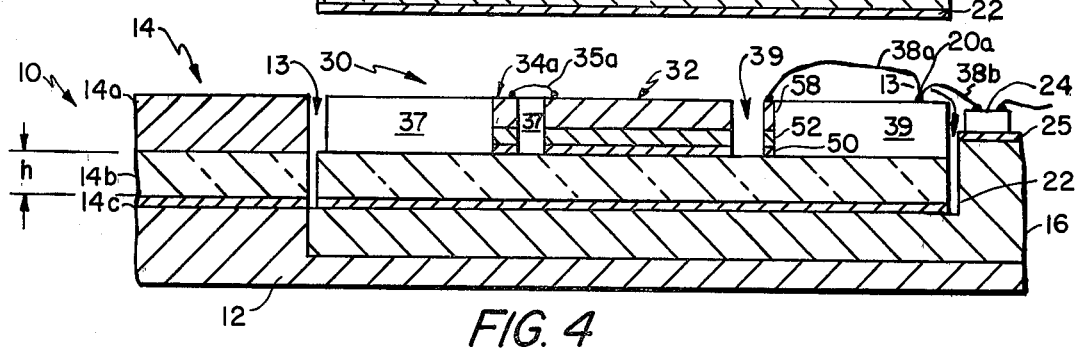

IMPEDANCE MATCHING NETWORK COMPRISING SELECTABLE CAPACITANCE PADS AND SELECTABLE INDUCTANCE STRIPS OR PADS

BACKGROUND OF THE INVENTION

This invention relates generally to impedance matching networks and more particularly to microwave impedance matching networks.

As is known in the art, for broadband high frequency applications, it is often necessary to use impedance matching networks for coupling a microwave frequency transmission line to a field effect transistor (FET). For example, the interelectrode capacitance of an FET may vary over a predetermined range for different FETs of the same device type. This variation of interelectrode capacitance complicates the impedance matching between the microwave transmission line and the FET since the capacitive component variation causes each FET to require a customized impedance matching network. Several approaches have been used in the prior art to fabricate the impedance matching networks. One approach is to use monolithic integrated circuit techniques to fabricate, on a common substrate, the transmission line, the matching network, and the FET device. One disadvantage with this approach is that precise process control is required because subsequent circuit adjustment in the matching network is not generally possible. A second disadvantage with this approach is that the high development and capital costs generally incurred in the production of monolithic microwave integrated circuits generally cannot be justified without a very large production volume. A second approach used in the prior art is to provide a hybrid circuit including metal on semiconductor (MOS) or metal on metal (MOM) capacitors. These capacitors are incorporated in an impedance matching circuit, for example, either by mounting them directly on the ground plane without a substrate or by mounting them on top of the substrate with plated holes passing through the substrate to the ground plane. One disadvantage with the use of MOS or MOM capacitors is that fabrication of such impedance matching networks requires additional processing steps for assembly, thus increasing the cost of the circuits and increasing the complexity of fabrication of the circuits. A second disadvantage is that the value of capacitance for MOS and MOM lumped capacitors is generally difficult to control and thus such capacitors provide less flexibility in providing customizable impedance matching networks.

SUMMARY OF THE INVENTION

In accordance with the present invention, an impedance matching network for coupling a microwave transmission line to a load is provided. The impedance matching network includes a plurality of conductive pads formed on a first surface of a dielectric substrate, each pad providing in combination with the dielectric of the substrate and a conductor formed on an opposite surface of the substrate, a predetermined capacitance. Selected ones of such conductive pads are electrically interconnected in parallel to form a capacitor having a value of capacitance related to the total surface area of such interconnected conductive pads. Such capacitor provides the requisite capacitive reactance for the impedance matching network. The impedance matching network further includes a strip conductor formed on the first surface of the substrate having a predetermined inductance per unit length and having a first end electrically connected to the network. A first end of a selected length of bonding wire is attached to such strip conductor at a point between the ends of such conductor to provide an inductor having an inductance related to the sum of the lengths of the bonding wire and the length of the strip conductor between the bonding point and the first end of such strip conductor. Such inductor provides the requisite inductive reactance for the impedance matching network. With such an arrangement an impedance matching network having electrical properties which are easily customized to match the capacitive characteristics of the load is provided. Such an impedance matching network may be used to easily obtain optimal electrical circuit characteristics by modifying the value of one or more of the reactive components of the impedance matching network. This impedance matching network provides a low cost, highly reproducible circuit for coupling a microwave transmission line, whose electrical characteristics are relatively well controlled, to a reactive load such as a field effect transistor (FET).

In accordance with an additional aspect of the present invention, the requisite inductive reactance may be provided by a second plurality of conductive pads formed on the first surface of the substrate and selectively electrically interconnected with selected lengths of bonding wire. The inductance of such an inductor is related to the total lengths of such bonding wires. With such an arrangement the inductive component of the impedance matching network may be modified or customized by bonding selective lengths of the bonding wires to such second plurality of conductive pads.

In accordance with an additional aspect of the present invention, a reactive element for an impedance matching network includes a plurality of conductive pads, each one of such pads having a predetermined surface area, and such plurality of conductive pads being electrically interconnected by a plurality of bond wires each one thereof having a predetermined length. With such an arrangement the reactive characteristics of a reactive component (i.e. inductive or capacitive) may be produced by selecting which ones of the conductive pads and/or lengths of the bonding wires are interconnected.

BRIEF DESCRIPTION OF THE DRAWINGS

For a better understanding of this invention, reference is made in the following more detailed description to the drawings wherein:

FIG. 1 is a plan view of a microwave circuit assembly including an impedance matching network according to the invention for coupling a microwave transmission line to the input of a field effect transistor (FET);

FIG. 1A is a schematic diagram of the impedance matching network shown in FIG. 1 including an impedance matching network for coupling the output of the FET to a microwave transmission line;

FIG. 2 is a cross-section of the impedance matching network in FIG. 1 at one stage in the fabrication of such impedance matching network;

FIG. 3 is a cross-section of the impedance matching network, as shown on FIG. 1, after metallization, such cross-section being taken along line 3—3 of FIG. 1;

FIG. 4 is a cross-section of the microwave circuit assembly shown in FIG. 1 taken along line 4—4 of FIG. 1;

DESCRIPTION OF THE PREFERRED EMBODIMENT

Figure 5:
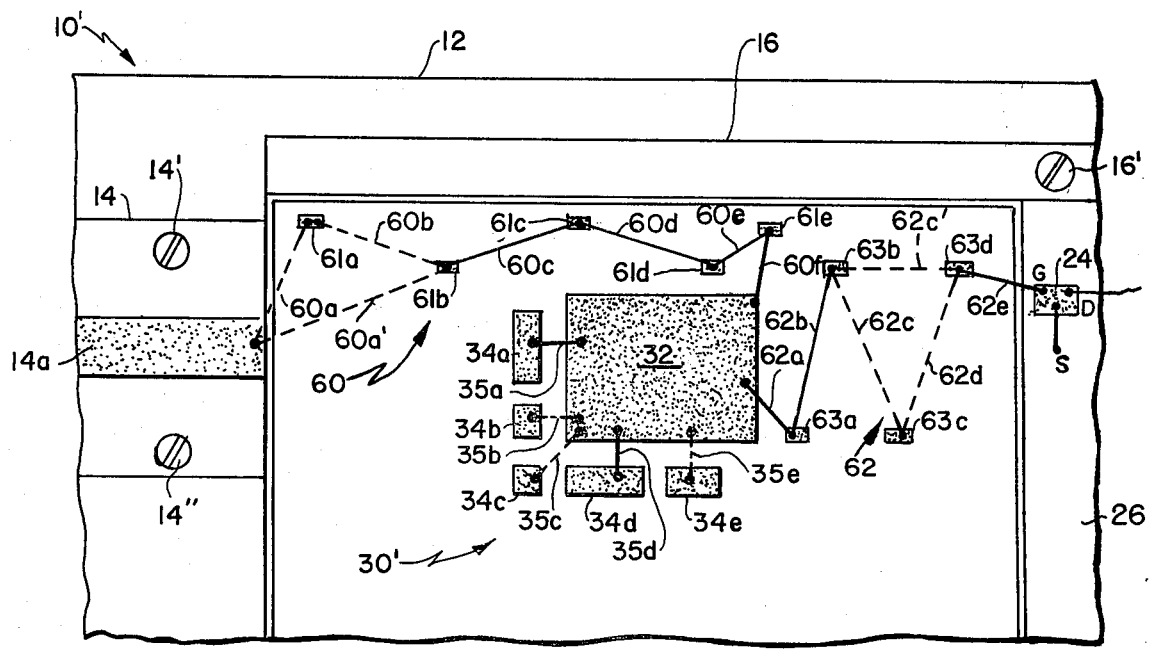
FIG. 5 is a plan view of a microwave circuit assembly according to an alternate embodiment of the invention.

Referring now to FIG. 1, a microwave circuit assembly 10 is shown to include a conductive support 12, here copper, to which is affixed a microwave transmission line 14, and a conductive support carrier 16, and an impedance matching network 30 disposed on the carrier 16. The microwave transmission line 14, here a 50 ohm microstrip transmission line, includes a dielectric substrate 14b, having a strip conductor 14a formed on the upper surface of the substrate 14b and a ground plane conductor 14c, (FIG. 4) here plated gold 200 microinches thick formed on the bottom side of such substrate 14b, as shown in FIG. 4. The microstrip transmission line 14 is fastened to the conductive package 12 by conventional mounting screws 14′, 14″, as shown. It is noted that the ground plane conductor 14c of the microstrip transmission line is in contact with, and hence electrically connected to the conductive support 12. The conductive support carrier 16, here copper, has a recessed portion 13 (FIG. 4) to receive an impedance matching network 30 (FIG. 3), as shown in FIG. 4. A dielectric substrate 20 (FIGS. 2, 3), here of aluminia has a conductive layer 22, here plated gold (200 microinches thick), formed on a first, here bottom surface thereof. The conductive layer 22 provides a ground plane conductor for the network 30. The impedance matching network 30 is used for matching the impedance of the microwave frequency transmission line 14 to a reactive load, here a field effect transistor (FET) 24. The FET 24 is mounted on a 200 microinch thick gold plated ground plane 25 formed on the elevated portion of the carrier, as shown in FIG. 4. The impedance matching network 30 includes here a large conductive pad 32 (FIGS. 1, 4) formed on the upper surface of substrate 20 and a plurality of smaller conductive pads 34a-34e formed on the upper surface of substrate 20, such smaller conductive pads 34a-34c here having different surface areas being formed here adjacent the periphery of the large conductive pad 32. Conductive pads 32, 34a-34e are separated from the ground plane conductor 22 by the substrate 20, such substrate 20 having a selective dielectric constant K, so that each of the conductive pads 32, 34a-34e has associated therewith a predetermined capacitance. In particular, the value of capacitance provided by each one of such conductive pads 32, 34a-34e is represented by the equation $C = (K\epsilon_o A)/t$ where K is the dielectric constant, $\epsilon_o$ is the permittivity of free space, A is the surface area of such one of the conductive pads 32, 34a-34e, and t is the separation of such one of the conductive pads 32, 34a-34ie from the ground plane conductor 22. A capacitor 33 (FIG. 1A) formed by electrical interconnection of the large conductive pad 32 and a selected one or ones of the smaller conductive pads 34a-34e, provides the requisite capacitive reactance for the impedance matching network 30. Thus, as shown in FIG. 1, pads 34d, 34e are connected to pad 32 to provide capacitor 33 with a value of capacitance related to the ones of the individual capacitance of each pad 32, 34d, 34e. If additional capacitance is required for capacitor 33, then one or more of the pads 34a, 34b, 34c may be bonded to pad 12 as shown by the dotted lines or if less capacitance is required for capacitor 33 then one or both of pads 34d, 34e may be disconnected from pad 32. The value of capacitance for the capacitor 33 may be selectively increased by bonding selective ones of the plurality of smaller conductive pads 34a-34e to the large conductive pad 32, with selective ones of short electrical conductors here bonding wires 35a-35e, as shown. Bonding wires 35a, 35c are shown in phantom to demonstrate that selective ones of such bonding wires 35a-35e are connected to the conductive pads 32, 34a-34e. Alternatively, such conductive pads 34a-34e are connected to the conductive pad 32 by a corresponding plurality of conductors (not shown) formed on the substrate 20. Selective ones of such conductive pads 34a-34e are disconnected from the conductive pad 32 by breaking the conductive path of selective ones of the conductors (not shown), such as by using a laser. Thus, two techniques are described to form a capacitor 33 with a desired value of capacitance related to the sum of the individual values of capacitance of each of the connected ones of the pads 32, 34a-34e. Lengths, generally, less than 5 mils are used to minimize the inductance of such bonding wires 35a-35e. Further, the inductance of the bonding wires 35a-35e may be reduced by bonding multiple wires (not shown) for each one of such bonding wires 35a-35e. By bonding (i.e. electrically interconnecting) selected ones of the smaller conductive pads 34a-34e to the larger conductive pad 32, the effective surface area of capacitor 33 is increased and hence the value of capacitance of capacitor 33 is proportionally increased.

The impedance matching network 30 further includes inductors 36, 38, (FIG. 1A). Inductors 36, 38 include as first portions thereof conductors 37, 39, respectively (FIG. 1) which are formed on the substrate 20. Each conductor 37, 39 has a first end 37a, 37b here electrically connected, and integrally formed, with the conductor pad 32. Inductors 36, 38 include as a second portion thereof, bonding wires 36a, 38a used to electrically interconnect the conductors 37, 39 to here the microstrip transmission line 14 and a substrate bonding point 20a, respectively. Inductor 38 includes as a third portion bonding wire 38b used to couple the FET 24 to bonding wire 38a at the substrate bonding point 20a. Each one of such conductors 37, 39 and bonding wires 36a, 38a provide a predetermined inductance per unit length. The value of inductance for each inductor 36, 38 is adjusted by connecting selected lengths of bonding wires 36a, 38a, to such conductor 37, 39 at a point between the ends of the conductors 37, 39, to change the length of such conductors 37, 39 and hence the value of inductance for the corresponding inductor 36, 38. As an illustrative example, the value of inductance for inductor 38 is adjusted by bonding one end of the bond wire 38a, here a 1 mil gold bond wire, to the conductor 39 between the connection of such conductor to the conductive pad 32 and the second end of the conductor 39. The second end of the bonding wire 38a is bonded to the bonding point 20a and the bonding wire 38b is bonded between the bonding point 20a and the gate electrode (G) of the common (grounded source (S)) field effect transistor 24, as shown. The FET 24 here includes a drain electrode (D) coupled to a similarily fabricated impedance matching network 40 (FIG. 1A). Thus, network 40 includes a capacitor 44 and inductors 42, 46 for providing impedance matching between the drain source output impedance of the FET and a microwave transmission line 50 (FIG. 1A). In general, the requisite value of inductance is selected by bonding wires between the bonding point 20a and the conductor 38 until one of the wires provides the requisite value of inductance. Alternatively, several wires, as shown by the dotted lines 38a', 38a'', may be bonded between the bonding point 20a and the conductor 38 along various points on the conductor 38. The total inductance then is equal to the parallel combination of such bonding wires 38a, 38a', 38a''. The inductance of the inductor may be increased, therefore, by selectively removing one or more of such bonding wires 38a, 38a', 38a'' until the requisite value of inductance of inductor 38 is provided. A connected portion 39', the length of conductor 39 electrically connected between here the conductive pad 32 and the bonding wire 38a, contributes a value of inductance to inductor 38, related to the length of such portion 39'. The unconnected portion 39'' of conductor 39 does not substantially affect the value of inductance of the inductor 38. The value of inductance of the inductor 38 is also related to the length of the bond wires 36a, 36b coupled between the connected portion 39' and the gate electrode (G) of the FET 24. Typically, a gold bond wire having a 1 mil diameter, suspended in air exhibits a characteristic impedance in the range of 100–200 ohms. The self inductance of a conductor or bonding wire is related to the impedance of such conductor by $L=(Z_o \tan \beta l)/\omega$ where $Z_o$ is the impedance of the conductor or bond wire; $\beta=2\pi/\lambda$, where $\lambda$ is the wavelength of the corresponding operating frequency; l is the length of the line; and $\omega$ is the radian frequency of operation. Thus, the inductance of the conductor portion 39', the bond wire 38a and hence the inductor 38 may be analytically determined.

Thus, the impedance matching network 30 may be selectively customized by monitoring the energy transfer characteristics of the impedance matching network 20 such as the amount of reflected energy and selecting values of inductance and capacitance as explained above to reduce or minimize such reflected energy.

Referring now to FIG. 2, fabrication of the impedance matching network 30 will be described. The substrate 20 having the conductive layer 22 formed on a bottom surface thereof provides one plate (the grounded plate) for the capacitor 33 provided by selectively interconnected ones of the conductive pads 32, 34a–34e. On the opposite or upper surface of the substrate 20 an adherent layer 50 such as titanium (Ti) is deposited to here a thickness of 500 Angstroms (A), by conventional techniques such as evaporation techniques. A conductive layer 52, here of gold (Au) is then sputtered on the contact layer 50 to a thickness in the range of 1000A–1500A. A layer 54 of photoresist is then deposited on the conductive layer 52, and is patterned and etched away in selective locations using well known photoresist techniques to expose portions of the surface of the conductive layer 52 areas 56 in the photoresist layer 54 corresponding to locations for the conductive pads 32, 34a–34e and conductors 37, 39.

Referring now to FIG. 3, after the exposed areas 56 (FIG. 2) are plated with a layer 58 of a conductive material, here gold (Au) to a thickness of 250 microinches, the photoresist layer 54 (FIG. 2) is removed. The sputtered Ti—Au layer 50, 52 from the areas previously covered by the photoresist mask are removed by conventional techniques such as ion milling or chemical etching leaving portions of such layers 50, 52 under the plated layer 58. Surface portions of layer 58 corresponding in thickness to the combined thickness of layers 50, 52 are uniformly removed from layer 58 by the ion milling operation. The thickness of this surface portion removed, however, is insignificant in comparison to the overall thickness of layer 58. Conductive pads 32, 34a–34e, and conductors 37, 39 are thus provided on the substrate 20.

Referring now to FIGS. 1, 1A, and 4, the substrate 20 is affixed by conventional means to the carrier 16 and such carrier 16 is affixed here by a screw 16' to the package 12, as shown. The package 12 has further affixed thereto, the microwave transmission line 14, by screws 14', 14'', as shown. The microwave frequency transmission line 14 includes the strip conductor portion 14a separated from a ground plane conductor 14e by the dielectric substrate 14b here of alumina. The width (w) of such strip conductor 14a, the material of such substrate 14b, and the thickness (h) of such substrate 14b are chosen to provide the microwave transmission line 14 with a predetermined characteristic impedance. The strip conductor portion 14a of the microwave transmission line 14 is electrically connected to the impedance matching network 30 via a bonding wire 36a which provides a portion of the inductance for inductor 36 in the same manner as described in conjunction with FIGS. 1, 1A for inductor 38. The carrier 16 has further affixed thereto, the top ground plane 25 to which is mounted the FET 24.

Figure 5A:
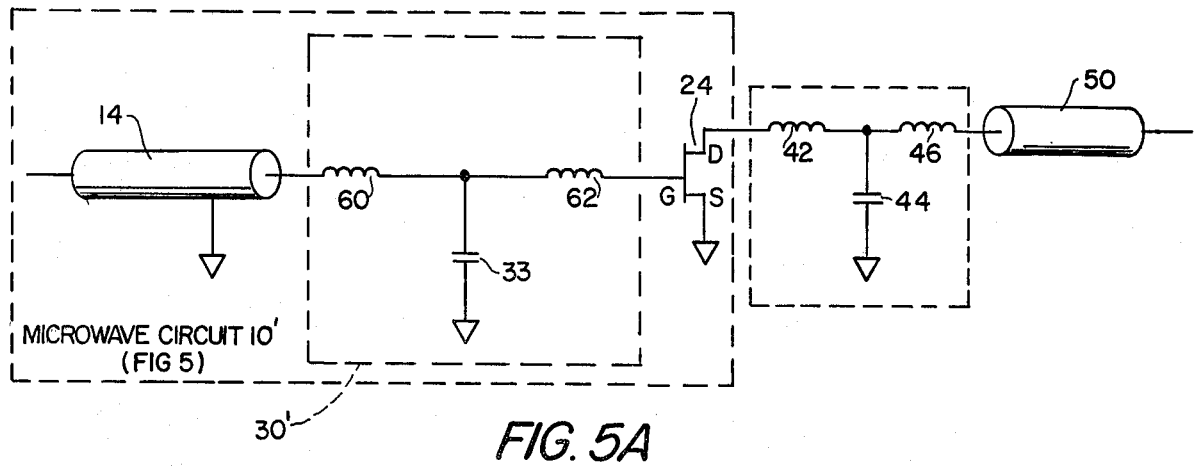
FIG. 5A is a schematic diagram of the microwave circuit assembly shown in FIG. 5.

Referring now to FIGS. 5, 5A an alternate embodiment of an impedance matching network 30' for coupling the microwave frequency transmission line 14 to the FET 24 includes the conductive pads 32, 34a–34e formed on the substrate 20, as described in conjunction with FIGS. 2, 3, and inductors 60, 62, connected as shown and as described in conjunction with FIG. 1. Inductors 60, 62 are provided by selective interconnection of lengths of bonding wires 60a–60f, 60a' and 62a–62e, 62c' to selected ones of bonding pads 61a–61e, 63a–63d, as shown. The value of inductance for inductor 62, for example, is related to the total length of the bond wires 62a–62f, 62c' which are used to form such inductor 62. The inductance of such bonding wires 60a–60f, 62a–62e may be approximated as $L=(Z_o \tan \beta l)/\omega$ as previously described in conjunction with FIGS. 1, 1A. By selective interconnection of selected ones of such bond wires 62a–62e to selective ones of such bonding pads 63a–63d a predetermined value of inductance for inductor 62 may be obtained. For example, bonding wire 62c' may be bonded between pads 63b and 63d to provide a shorter pathlength and hence lower inductance for inductor 62 than the path of bonding wires 62c, 62d being bonded between pads 63b, 63c and 63d, as shown. Bonding pads 61a–61e, 63a–63d are formed in the same manner as the conductive pads 32, 34a–34e except that the surface area of such bonding pads 61a–61e, 63a, 63d is substantially smaller than that of the conductive pads 32, 34a–34e, so as to minimize the capacitance provided by such bonding pads 61a–61e, 63a–63d.

The preferred substrate thickness, for a given type of substrate material, is determined by the range of values of capacitance and inductance required for a particular application, in relation to restrictions imposed on edge length necessary to insure that the lumped components exhibit lumped component electrical characteristics.

As in known in the art, in order for a capacitor to exhibit electrical characteristics corresponding to a lumped capacitor, the physical length of such capacitor must be substantially less than one quarter of a wavelength of the corresponding frequency of operation. Shown in Table 1 are illustrative values of capacitance for the lumped element capacitors formed on a 10 mil thick alumina substrate having a dielectric constant $\kappa = 9.8$, in relation to the frequency of operation. As shown in Table 1, with higher operating frequencies, the edge length of a capacitor must decrease to insure that the capacitor exhibits lumped component characteristics.

TABLE 1

| Area (mil²) | Edge of Sq. (mil) (approximate) | Capacitance (pf) | λ/8 (mils) | Frequency (GHz) |
|---|---|---|---|---|
| 3586 | 60 | 0.8 | 143 | 4 |
| 2242 | 47 | 0.5 | 94.7 | 6 |
| 897 | 30 | 0.2 | 71 | 8 |
| 448 | 21.2 | 0.1 | 49 | 12 |
| 225 | 15 | 0.05 | 32 | 18 |

Table 2 is a comparison of an edge of square area required to achieve a given value of capacitance for various substrate thickness of alumina ($\kappa = 9.8$).

TABLE 2

| Capacitance (pf) | Edge Length of Sq. Area (mil) | | | λ/8 (mil) | f (GHz) |
|---|---|---|---|---|---|
| | 10 mil | 15 mil | 25 mil | | |
| 0.8 | 60 | 73.3 | 94.7 | 143 | 4 |
| 0.5 | 47 | 57.9 | 74.8 | 94.7 | 6 |
| 0.2 | 30 | 36.6 | 47.4 | 71 | 8 |
| 0.1 | 212 | 25.9 | 33.4 | 49 | 12 |
| 0.05 | 15 | 18.3 | 23.6 | 32 | 18 |

Increasing the thickness of the the substrate 12 results in a proportional increase of the required surface area of a conductive pad to provide a predetermined value of capacitance, as shown in Table 2. However, in order to insure that the parallel plate capacitor 18 exhibits lumped capacitor electrical characteristics, the edge length of the parallel plate capacitor 18 must be substantially smaller than a quarter wavelength. This requirement is most easily satisfied with thin substrates.

However, as is also known in the art, in order for an inductor to exhibit electrical properties corresponding to a lumped inductor, the physical length of such an inductor must be substantially less than one quarter of a wavelength of the corresponding frequency of operation. Since inductors 36, 38, for example, are provided by strip conductors 37, 39 and the ground plane conductor 22, separated by the dielectric substrate 20, the inductors 36, 38 are merely high impedance microstrip transmission lines. The inductance of a high impedance microstrip transmission line is proportional to its impedance $Z_o$ ($L = [Z_o \tan(\beta l/\omega)]$) and the impedance of such a line is inversely proportional to the ratio (w/h) where w is conductor width and h is the substrate thickness, as explained in conjunction with FIG. 1. The substrate thinness is limited by the conductor due to two effects: ground plane losses when the conductor is very close to the ground plane: and the ratio (w/h), that is as h the substrate thickness decrease the conductor width w must also decrease in proportion thereto, in order to maintain a constant impedance $Z_o$. To permit bonding of a 1 mil bonding wire to the conductor 39, as explained above, the width w of the conductor 39 should be at least substantially equal to 1 mil. Thus the ratio (w/h) also affects the lower limit on the minimum substrate thickness.

For an alumina substrate, a 10 mil thick substrate is here the preferred substrate thickness for low power applications up to frequency ranges of approximately 16 Ghz. With a 10 mil substrate, inductor losses due to the inductors proximity to the ground plane are not significant and the substrate thickness of 10 mil permits utilization of a conductor having a width (w) of approximately 1 mil and a impedance of 120 ohms. Further with a substrate of 10 mil as shown in Tables 1 and 2, the attainable values of capacitance for constant surface area are larger than those obtained with thicker substrates. Other substrate materials such as a ceramic type may have different electrical properties including dielectric constant properties, and thus may have different preferred thicknesses. Further, for other applications such as high power amplifiers requiring relatively high values of capacitance for capacitors and low values of inductance for inductors, substrate thickness when using alumina, for example, may be reduced to 5 mil.

Having described preferred embodiments of the invention it will now be apparent to one of skill in the art that other embodiments incorporating its concept may be used. It is believed therefore that this invention should not be restricted to the disclosed embodiments, but rather should be limited only by the spirit and scope of the appended claims.

What is claimed is:

1. A capacitor having a selected capacitance comprising:
a dielectric substrate having a conductive layer on one surface thereof;
a first conductive pad disposed on a portion of the opposite surface of the substrate, said first conductive pad, dielectric substrate and conductive layer providing a first capacitor having a predetermined capacitance;
a plurality of additional conductive pads disposed on second portions of such opposite surface of the substrate, and disposed in a region adjacent to the first conductive pad, such plurality of additional pads, dielectric substrate and conductive layer providing a like plurality of capacitors, each having a predetermined capacitance; and
means electrically interconnecting a selected one or ones of such additional conductive pads to the first conductive pad, the remaining unselected one or ones of such additional pads being electrically decoupled from the first conductive pad, for providing the capacitor having the selected capacitance.

2. An inductor having a selected inductance between a pair of terminals thereof comprising:
a dielectric substrate having a conductive layer on one surface thereof;
a plurality of bonding pads disposed adjacent each other on the opposite surface of the substrate; and
a plurality of wires, a first one of such wires having a first end providing a first terminal of the inductor and a second end connected to a first one of the plurality of conductive pads, a succeeding wire having a first end providing the second terminal of the inductor and a second end connected to a succeeding one of the plurality of conductive pads, the remaining one or ones of such wires selectively cascade interconnecting a selected one or ones of such pads, between the first and succeeding one of such bonding pads, with the remaining one or ones of such pads being left electrically isolated.

3. A microwave frequency circuit having capacitive and inductive reactive components electrically interconnected comprising:
- a dielectric substrate having a conductive layer formed on a first surface thereof;
- a plurality of conductive pads disposed on portions of the opposite surface of the substrate and disposed adjacent each other, such plurality of conductive pads, dielectric substrate and conductive layer providing a first plurality of capacitors, each having a predetermined capacitance;
- a plurality of bonding pads formed on second portions of such opposite surface of the substrate;
- first means, electrically interconnecting selected one or ones of such plurality of conductive pads, with the remaining unselected one or ones being electrically isolated from each other for providing such capacitive reactive component having a selected capacitance; and
- second means electrically interconnecting selected ones of such plurality of bonding pads for providing such inductive component having a selected inductance.

4. A microwave frequency circuit having capacitive and inductive reactive components electrically coupled together comprising:
- a dielectric substrate having a conductive layer disposed on a first surface thereof;
- a plurality of conductive pads disposed on portions of the opposite surface of the substrate and disposed adjacent each other, such plurality of conductive pads, dielectric substrate and conductive layer providing a corresponding like plurality of capacitors, each having a predetermined capacitance;
- first means, electrically interconnecting a selected one or ones of such conductive pads for providing at least one capacitive reactive component with a selected capacitance with remaining unselected ones being electrically isolated from each other;
- a conductor having a pair of end portions disposed on second portions of such opposite surface of the substrate; and
- a wire having a first end electrically interconnected at a point on the conductor disposed between the end portions of such conductor and a second end disposed at the second one of the terminals of the conductor.

5. A method comprising the steps of:
providing a dielectric substrate having a plurality of conductive pads disposed adjacent each other on a first surface thereof, and a conductive layer formed on a second surface opposite the first surface, said plurality of conductive pads, conductive layer and dielectric substrate providing a plurality of capacitors, each having a predetermined capacitance; and
interconnecting a selected one or ones of such conductive pads while leaving unconnected the remaining unselected one or ones of the conductive pads to provide a capacitive component having a selected capacitance.

6. A method for providing an inductor having a selected inductance and a capacitor having a selected capacitance, said capacitor being electrically interconnected to a first end of said inductor comprising the steps of:
providing a dielectric substrate having a plurality of conductive pads disposed on first portions of a first surface thereof, a conductor having a pair of end portions, a first end portion forming the first end of the inductor disposed on a second portion of such first surface, and a conductive layer formed on a second surface of such substrate opposite the first surface;
interconnecting a selected one or ones of such conductive pads for providing a capacitor having a selected capacitance while leaving unconnected the remaining unselected one or ones of the conductive pads; and
interconnecting a selected length of bonding wire at a first end to such conductor at a point on the conductor between the pair of end portions of the conductor to provide an inductive reactive component with the second end of the wire being disposed at a second terminal of the inductor.

* * * * *

UNITED STATES PATENT OFFICE
CERTIFICATE OF CORRECTION

Patent No. 4,479,100     Dated October 23, 1984

Inventor(s) Sanjay B. Moghe, Roger E. Gray and Wei Tsai

It is certified that error appears in the above-identified patent and that said Letters Patent are hereby corrected as shown below:

On the title page;

Page 1 of the patent, at Attorney, Agent, or Firm, add "Denis G. Maloney" before "Richard M. Sharkansky";

Column 3, line 58, delete "34a-34ie" and replace with --34a-34e--.

Signed and Sealed this

Sixth Day of August 1985

[SEAL]

Attest:

DONALD J. QUIGG

*Attesting Officer*     *Acting Commissioner of Patents and Trademarks*